(12) United States Patent
Tong et al.

(10) Patent No.: US 10,101,778 B2
(45) Date of Patent: Oct. 16, 2018

(54) PRINTED CIRCUIT BOARD ASSEMBLIES

(71) Applicant: Hewlett-Packard Development Company, L.P., Houston, TX (US)

(72) Inventors: Szu Tao Tong, Taipei (TW); Hsin-Tso Lin, Taipei (TW); Cheng-Yi Yang, Taipei (TW); Hai-Ling Hung, Taipei (TW); Chien-Hao Lu, Taipei (TW)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/567,603

(22) PCT Filed: May 28, 2015

(86) PCT No.: PCT/US2015/032940
§ 371 (c)(1),
(2) Date: Oct. 18, 2017

(87) PCT Pub. No.: WO2016/190878
PCT Pub. Date: Dec. 1, 2016

(65) Prior Publication Data
US 2018/0120907 A1     May 3, 2018

(51) Int. Cl.
| | |
|---|---|
| *H05K 1/02* | (2006.01) |
| *G06F 1/18* | (2006.01) |
| *G06F 1/20* | (2006.01) |
| *H05K 1/11* | (2006.01) |
| *H01R 29/00* | (2006.01) |
| *G05B 15/02* | (2006.01) |
| *H05K 1/18* | (2006.01) |

(52) U.S. Cl.
CPC ............. *G06F 1/184* (2013.01); *G05B 15/02* (2013.01); *G06F 1/206* (2013.01); *H01R 29/00* (2013.01); *H05K 1/0266* (2013.01); *H05K 1/11* (2013.01); *H05K 1/181* (2013.01); *H01R 2201/06* (2013.01)

(58) Field of Classification Search
CPC .................................................. H05K 1/0266
See application file for complete search history.

(56) References Cited

U.S. PATENT DOCUMENTS

| | | | |
|---|---|---|---|
| 3,567,914 A | 3/1971 | Neese et al. | |
| 6,259,032 B1 * | 7/2001 | Fernandez | ............... H01R 4/64 |
| | | | 174/138 E |

(Continued)

FOREIGN PATENT DOCUMENTS

| | | |
|---|---|---|
| JP | 2004297016 | 10/2004 |
| JP | 2006351537 | 12/2006 |

(Continued)

OTHER PUBLICATIONS

Part 3: Carrier Sense Multiple Access with Collision Detection (CSMA/CD) access method and Physical Layer specifications, Jun. 22, 2010, pp. 1-790, IEEE.

*Primary Examiner* — Adrian S Wilson
(74) *Attorney, Agent, or Firm* — HP, Inc. Patent Department

(57) ABSTRACT

An example printed circuit board assembly (PCBA) includes a controller and a plurality of conductive contacts. The conductive contacts are coupled to the controller. The controller is to determine a type of chassis to which the PCBA is mounted.

15 Claims, 6 Drawing Sheets

(56) References Cited

U.S. PATENT DOCUMENTS

| | | | |
|---|---|---|---|
| 6,301,124 B1 | 10/2001 | Nikazm et al. | |
| 7,768,797 B1 | 8/2010 | Hockin | |
| 8,043,098 B2 * | 10/2011 | Huang | H05K 9/0067 |
| | | | 439/95 |
| 2010/0149738 A1 | 6/2010 | Chang et al. | |
| 2014/0247131 A1 | 9/2014 | Bunker et al. | |
| 2014/0297855 A1 | 10/2014 | Moore et al. | |
| 2015/0058506 A1 | 2/2015 | Mühsam | |

FOREIGN PATENT DOCUMENTS

| | | |
|---|---|---|
| JP | 2014533399 | 12/2014 |
| KR | 1020080013411 | 2/2008 |

\* cited by examiner

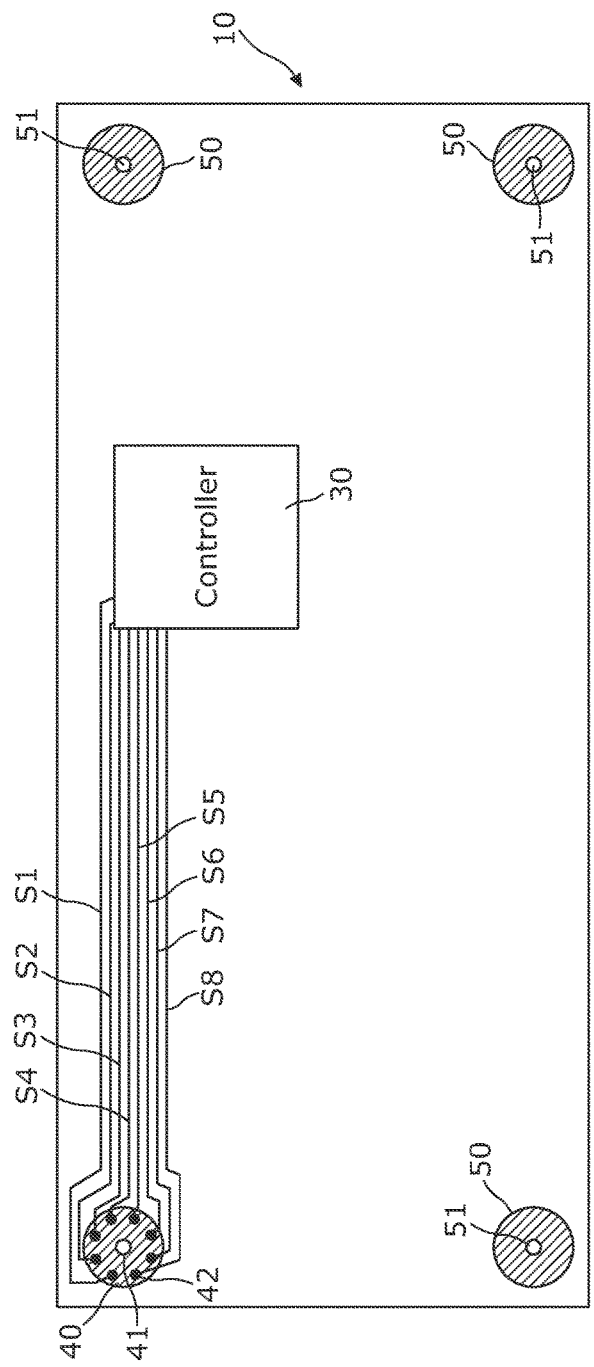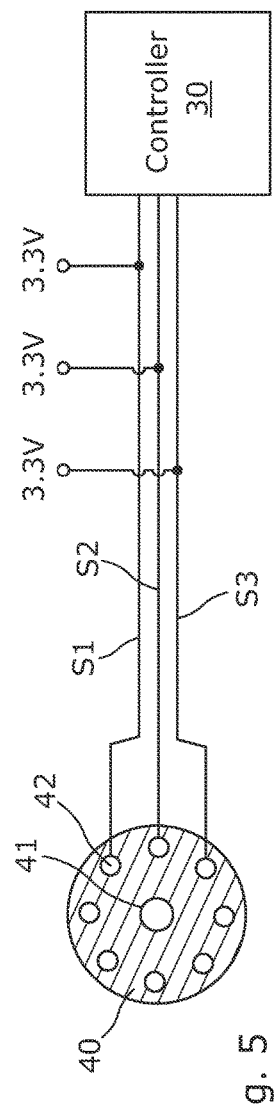

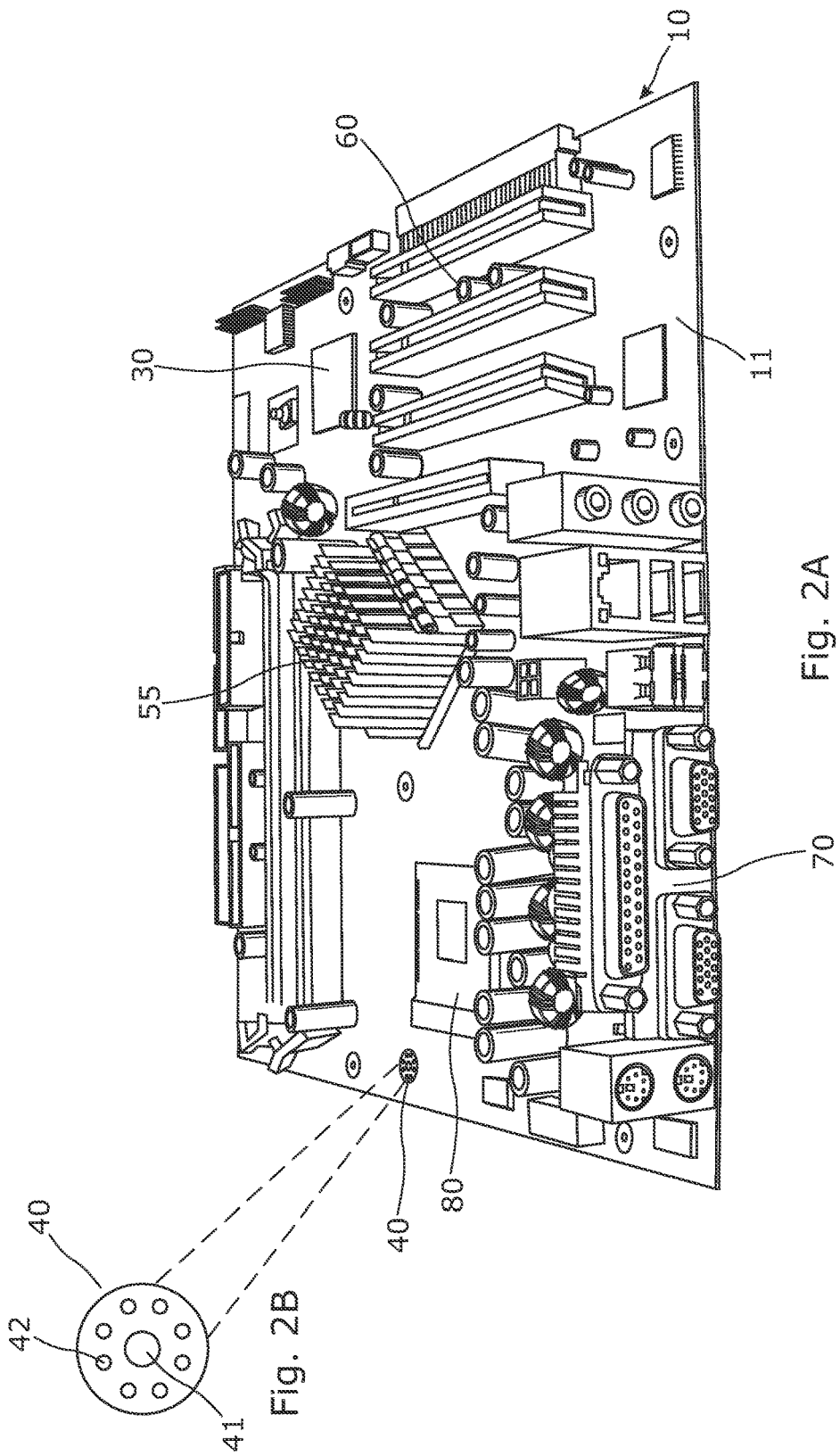

| Chassis Type | Firmware Config | Binary Code | Conductive Contact Arrangement |
|---|---|---|---|
| Tower 1 | Config 1 | 00000001 | 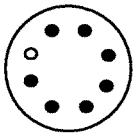 |
| Tower 2 | Config 2 | 00000010 | 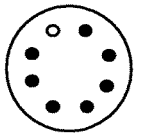 |
| Desktop | Config 3 | 00000011 | 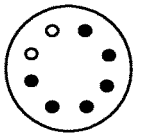 |
| Notebook | Config 4 | 00000100 | 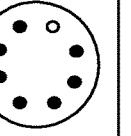 |
● Contact with chassis
○ No contact with chassis
Fig. 6

PRINTED CIRCUIT BOARD ASSEMBLIES

BACKGROUND

Many electronic and computer devices comprise a printed circuit board assembly, such as a motherboard, mounted to a chassis. The printed circuit board assembly may include a processor, memory and other electronic components mounted to a substrate. The chassis supports the printed circuit board assembly and may form an exterior casing of the device.

It is possible for a same printed circuit board assembly to be used with a plurality of different chassis, for example in a plurality of different computing devices. For example the same printed circuit board assembly may be used in a desktop computer, notebook computer or a tower computer, or computer integrated into a monitor. Various configurations such as the fan speed, I/O arrangements and other characteristics may differ between the different computer devices and chassis. These configurations may be set during initialization of the computing device.

BRIEF DESCRIPTION OF THE DRAWINGS

Examples of the present disclosure will now be described, by way of non-limiting example, with reference to the accompanying drawings, in which:

FIG. 1 shows an example plan view of a printed circuit board assembly according to the present disclosure;

FIGS. 2A and 2B show further views of an example printed circuit board assembly;

FIG. 5 is an example circuit diagram;

FIG. 6 is an example table showing binary code and configurations; and

DETAILED DESCRIPTION

Figure 3A:
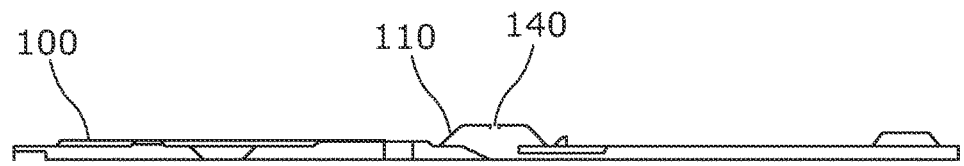
FIG. 3A to 3C show views of part of an example chassis.

FIG. 1 shows a plan view of a printed circuit board assembly (PCBA) 10 according to an example of the present disclosure. The PCBA includes a plurality of engagement features 50, 40 to secure the PCBA to a chassis. The chassis (not shown in FIG. 1) may be an outer casing of a computer device, such as a desktop, tower computer, notebook etc. In the illustrated example each of the engagement features 40, 50 includes a through-hole 51, 41. A fastener, such as a bolt, screw, or other elongate member may be inserted through the through-hole to secure the PCBA to the chassis.

A plurality of electrically conductive contacts 42 are arranged on a surface of the PCBA next to one of the through-holes 41. In the context of this disclosure the term "next to" means on at least one side of and in close proximity to. The conductive contacts 42 may be arranged around the through-hole 41 and may in some cases surround the through-hole. The term "around" means on at least two sides of, while the term "surround" means on four sides of. The conductive contacts may be arranged in a circle around the through-hole, for example as shown in FIG. 1. Each of the conductive contacts 42 is formed of an electrically conductive material and is electrically insulated from the other conductive contacts. For example, the conductive contacts may be formed of a metal such as copper.

Each of the conductive contacts 42 is electrically coupled to a controller 30 by a respective signal line S1, S2, S3, S4, S5, S6, S7 or S8. Each of the signal lines S1 to S8 may convey a signal to the controller indicating whether or not the conductive contact 42, which it is coupled with, is in electrical contact with the chassis. Whether or not a particular conductive contact 42 is in electrical contact with the chassis will depend on the type of chassis. In that way the controller may determine a type of the chassis, as is explained below.

FIG. 2A is a perspective view showing an example PCBA in more detail. The PCBA may be a motherboard of a computing device. The PCBA includes an electrically insulating substrate 11. Various electronic components are mounted on the substrate 11 and connected to each other through electrically conductive lines embedded in the substrate. Similar to FIG. 1, the PCBA includes an engagement feature 40 including a through-hole 41 in the substrate. The through-hole 41 is surrounded by a plurality of conductive contacts 42 on the surface of the substrate as shown in FIG. 2B. The PCBA further includes a controller 30. The controller may be an application specific integrated chip (ASIC), field programmable gate array (FPGA) or other processor to execute various PCBA initialization and configuration functions. The controller 30 may be coupled to the conductive contacts 42 in a similar manner to that shown in FIG. 1. In addition the PCBA may also include further electronic components mounted to the substrate, including for example a second controller 55, memory 60, Input/Output (I/O) interfaces 70 and a CPU or socket 80 that is to receive a CPU. In the illustrated example the controller 30 is a southbridge and the second controller 55 is a northbridge. In other examples, the conductive contacts 42 around the through-hole 41 may be coupled to the second controller 55, or the CPU. In still other examples the northbridge and southbridge controllers may be integrated into the CPU rather than being separate parts.

FIG. 3A is an example profile view of a part of a chassis 100 including an engagement feature that is to secure the chassis to the PCBA. In this example, the engagement feature includes an aperture 140. The engagement feature may be formed on an elevated portion 110 of the chassis. Thus in the example of FIG. 3A, the engagement feature includes an aperture 140 in the top of an elevated or anthill like projection 110 of the chassis.

Figure 3B:
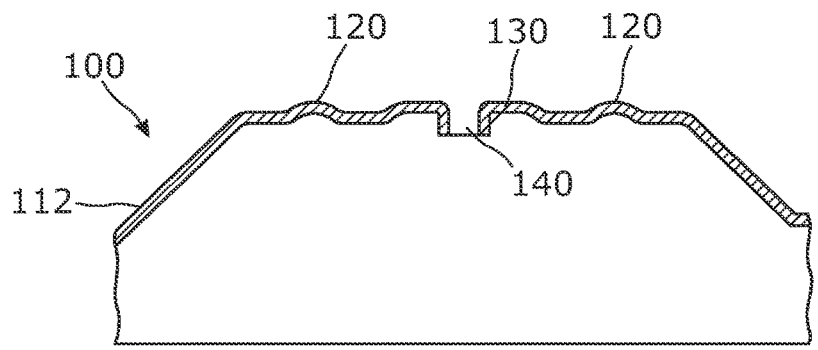
Figure 3C:
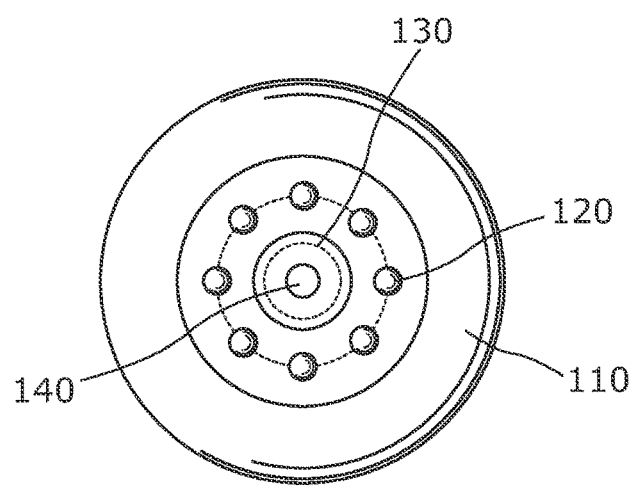

FIG. 3B shows the engagement feature of the chassis in more detail and FIG. 3C is a view from above. As can be seen most clearly in FIG. 3C, a number of conductive contacts 120 are provided on top of the elevated anthill portion 110 next to the aperture 140. In the context of this disclosure the phrase "a number of conductive contacts" means one conductive contact or more than one conductive contact. In the illustrated example there are eight conductive contacts arranged in a circle around the aperture 140. However, this is just an example and in other examples there could be a lower or higher number of conductive contacts and they may have a different arrangement. As will be discussed later the number and/or pattern of conductive contacts may be used as a code to indicate a chassis type. Each conductive contact 120 of the chassis may be arranged so as to align with a respective corresponding conductive contact 42 of the PCBA, such that the aligned conductive contacts of the PCBA and the chassis contact with each other when the PCBA and chassis are secured together.

As can be seen in FIG. 3C, the anthill like elevated portion 110 of the chassis and the conductive contacts 120 may be coated with an electrically conductive surface 112. This conductive surface 112 may be connected to a circuit ground. In this way all of the conductive contacts 120 may be grounded. Also, as shown in FIGS. 3B and 3C, the conductive contacts 120 may be bump like projections. Bump like projections are cheap to manufacture. A locating ridge 130 may surround the aperture 140.

Figure 4A:
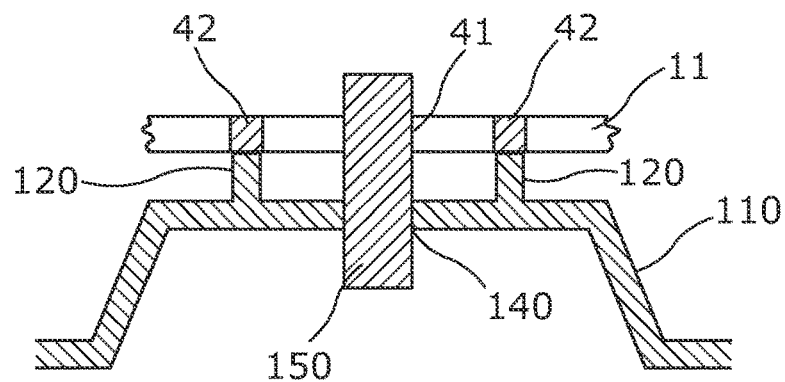
FIGS. 4A to 4C are examples of a part of the printed circuit board assembly mounted to the chassis.

FIG. 4A is a schematic cross section type diagram showing one example of how the PCBA 10 may be secured to the chassis 100. As described above, the chassis includes an elevated portion 110 and an aperture 140 in the top of the elevated portion 110. Further, there are a number of electrically conductive contacts 120 projecting upwardly from the top of the elevated portion and surrounding the aperture 140. Meanwhile the PCBA substrate 11 has a through-hole 41 which is aligned with the aperture 140 of the chassis. A fastener 150, such as a bolt, screw, or other elongate member is inserted through both the through-hole 41 of the PCBA and the aperture 140 of the chassis to secure the PCBA to the chassis. In some examples, the aperture 140 may include a screw thread to receive a screw. As shown in FIG. 4A the conductive contacts 120 of the chassis are positioned to align with and contact with corresponding conductive contacts 42 of the PCBA, when the through-hole of the PCBA is aligned with the aperture of the chassis.

Figure 4B:
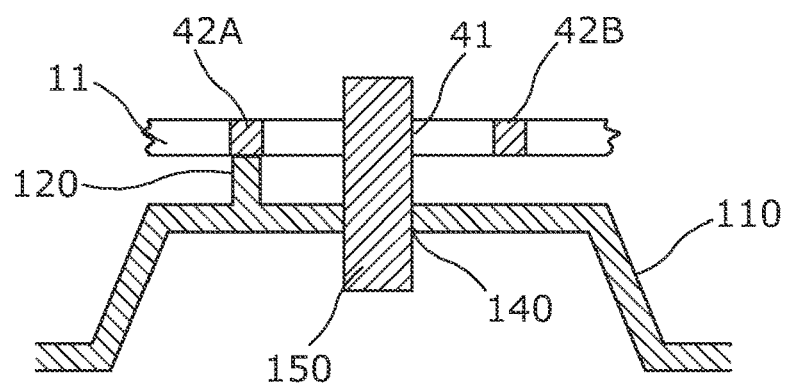

FIG. 4B shows another example, which is the same as FIG. 4A, except that there are fewer conductive contacts on the chassis, so that just one conductive contact 42A of the PCBA on the left of FIG. 4B connects with a conductive contact 120 of the chassis. The conductive contact 42B on the right of FIG. 4B does not connect with a conductive contact of the chassis, as there is no corresponding conductive contact on the chassis for it to contact with.

Figure 4C:
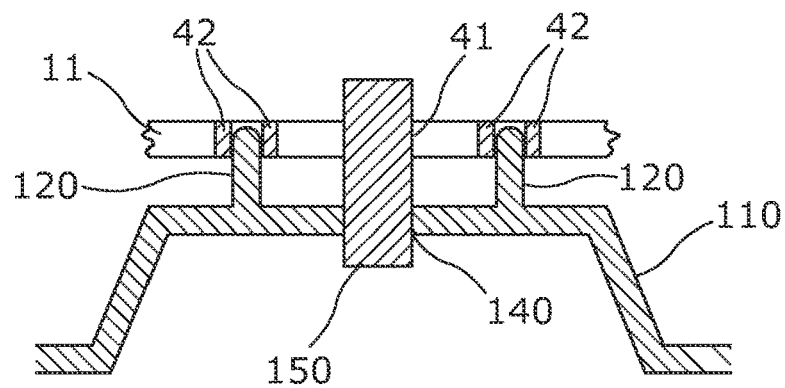

FIG. 4C shows another example, which is similar to FIG. 4A, except that in FIG. 4A the conductive contacts 42 of the PCBA are solid pads, whereas in FIG. 4C each conductive contact 42 of the PCBA includes an aperture to receive a projecting conductive contact 120 of the chassis. This feature may help in aligning the PCBA with the chassis and may help to ensure a correct orientation and connection between corresponding conductive contacts of the PCBA and the chassis.

FIG. 4A to 4C are just examples and other variations are possible. In other examples the aperture 140 may be in a flat or recessed portion of the chassis, rather than an elevated portion of the chassis. However, having the aperture in an elevated portion of the chassis may help to ensure isolation of the rest of the PCBA from the chassis and/or facilitate easy alignment of the PCBA with the chassis. In other examples the conductive contacts 120 of the chassis may be flush with the chassis, instead of bump like projections. However, when the conductive contacts 120 are bump like projections it is easier to ensure that the conductive contacts 42 of the PCBA not aligned with a corresponding conductive contact 120 of the chassis remain electrically isolated from the chassis. As the conductive contacts of the PCBA are next to the through-hole and the conductive contacts of the chassis are next to the aperture, it is easy to ensure alignment of the conductive contacts with each other when the through-hole and the aperture are aligned. Furthermore, by encoding a chassis type in the arrangement of conductive contacts next to the through-hole, this method allows two different chassis to be distinguished from each other, even if they have through-holes in the same location as each other. Further, having the conductive contacts next to the through-hole allows for an efficient use of space, without interfering with other parts of the PCBA.

As shown in FIG. 1, the conductive contacts 42 around the through-hole 41 of the PCBA are coupled to a controller 30. Because of this the controller 30 is able to detect which conductive contacts 42 are in contact with a conductive contact 120 of the chassis and which are not. One way of realizing this is shown in the example circuit diagram of FIG. 5. Each conductive contact next to the engagement feature 40 of the PCBA is coupled to the controller 30 by a respective signal line. For clarity signals S1, S2 and S3 are shown, but signal lines S4 to S8 are not shown in FIG. 5. Each of the signal lines is connected to a pull up voltage, which in this example is 3.3V but may be in any suitable voltage. When a conductive contact 42 of the PCBA is in contact with a corresponding conductive contact of the chassis, then the signal line is effectively grounded as the conductive contact of the chassis is connected to the circuit ground. In that case the pull up voltage flows to the circuit ground and the controller senses a low voltage, e.g. 0V, on that signal line. However, if a signal line is coupled to a conductive contact 42 of the PCBA that is not in contact with a corresponding conductive contact of the chassis, then that signal line is not grounded and the pull up voltage flows to the controller 30 such that the controller 30 senses a high voltage on that signal line. In this way the controller can detect which conductive contacts 42 are in contact with a conductive contact of the chassis. FIG. 5 is just one example and there are other possible circuit arrangements by which a controller may detect which conductive contacts of a PCBA are in contact with a chassis conductive contact. For example, a conductive contact between the PCBA and the chassis may act as a switch closing a circuit between a high voltage signal and an input of the controller.

The controller may store a plurality of firmware configuration data suitable for different types of chassis. Each firmware configuration data may include parameters such as fan speed, I/O configuration or mapping, etc. that depend on the type of chassis. FIG. 6 shows an example table in which each row corresponds to a particular chassis type. The first column gives a name of the chassis type, the second column a corresponding firmware configuration, the third column a binary code representing the chassis type and the fourth column an arrangement of conductive contacts next to the engagement feature or through-hole which results in the binary code being communicated to the controller.

Thus, for example, a first type of tower computer Tower 1 has "config 1" firmware configuration and a binary code of 00000001 which is produced when all except the first conductive contact of the PCBA is in contact with a corresponding conductive contact of the chassis. That is the conductive contacts of the PCBA that are in contact with a conductive contact of the chassis are grounded and therefore a low voltage or 0 is detected by the controller on the corresponding signal lines. However, there is no chassis conductive contact corresponding to the first conductive contact of the PCBA and therefore the first signal line has a high voltage or 1. The second tower type has a config 2 firmware, a binary code of 00000010 as the chassis has just one conductive contact in a position that corresponds to and connects with the second conductive contact of the PCBA. The desktop chassis has a config 3 file and a binary code of 00000011 and a conductive contact in all but the first and second positions of the chassis. The notebook chassis has a config 4 file and a binary code of 00000100 and a conductive contact aligned with the third conductive contact of the PCBA. In one implementation the binary code may be stored in a register of the controller and the controller may compare binary signals received on the signal lines to the binary code in the register to determine the type of chassis which the PCBA is mounted to.

In other examples there could be more or fewer contacts on the PCBA. Generally the potential number of contacts on the chassis is between 0 and N where N is the number of conductive contexts on the PCBA next to the through-hole. When N is equal to 8 there are 256 possible combinations of contacts being present or not present in each position on the chassis and thus 256 binary codes. If N is 4 then there are 16 combinations. Thus even with just four conductive contacts on the PCBA, it is possible to support and detect up to 16 types of chassis. While the above example uses a binary code, in other examples the controller may determine the type of chassis based on the total number of PCBA conductive contacts next to the through-hole which are in contact with a conductive contact of the chassis, or based on which particular one of the PCBA conductive contacts is in contact with a conductive contact of the chassis, e.g. if a first conductive contact of the PCBA is in contact with a conductive contact of the chassis this indicates a first type of chassis, if a second conductive contact of the PCBA is in contact with a conductive contact of the chassis this indicates a second type of chassis etc. All of the above approaches may be generically referred to as "based on an arrangement of the conductive contacts on the chassis". Among these approaches, determining based on a binary code is more efficient in terms of the number of possible supported configurations, compared to basing the determination on the total number of contacts.

Figure 7:
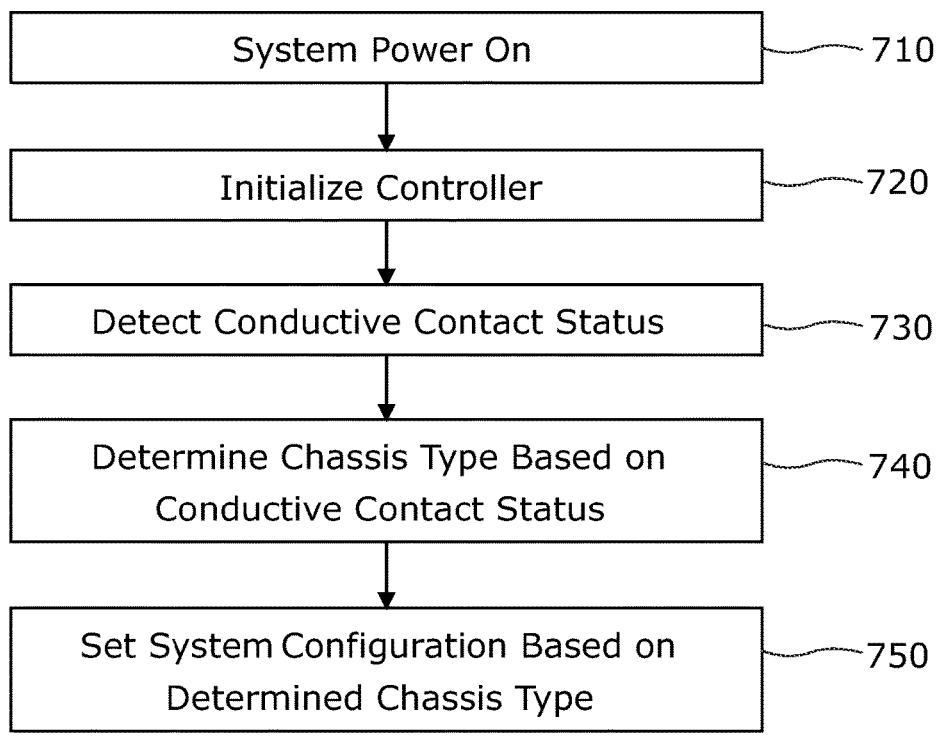
FIG. 7 is an example flow diagram of a method of configuring a system.

FIG. 7 is a flow diagram of a method of configuring a computer system. It may for example be implemented by a PCBA according to the above examples. At block 710 the system is powered on. At block 720 the controller is initialized. At block 730 the controller detects the status of each of the PCBA conductive contacts which it is coupled to. At block 740 the controller determines what type of chassis the PCBA is mounted to. This determination is based on the status of the PCBA conductive contacts. For example, the determination may be based on the total number of conductive contacts on the chassis in contact with the PCBA, based on whether a particular contact of the PCBA is in contact with the chassis, or based on a binary code generated based on which conductive contacts of the PCBA are in contact with a conductive contact of the chassis. At block 750 the controller sets configuration data based on the determined chassis type.

All of the features disclosed in this specification (including any accompanying claims, abstract and drawings), and/or all of the blocks of any method or process so disclosed, may be combined in any combination, except combinations where at least some of such features and/or blocks are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A printed circuit board assembly (PCBA) for a computing device comprising:
   a substrate;
   a controller mounted to the substrate and a through-hole in the substrate to receive a member to secure the PCBA to a computing device chassis; and
   a plurality of electrically conductive contacts on a surface of the PCBA next to the through-hole, each electrically conductive contact being electrically insulated from other electrically conductive contacts and coupled to the controller by a respective signal line;
   wherein the controller is to determine a type of the computing device chassis based on signals received from the respective signal lines.

2. The printed circuit board assembly of claim 1 wherein the conductive contacts are arranged in a circle around the through-hole.

3. The printed circuit board assembly of claim 1 wherein each of the electrically conductive contacts includes an aperture to receive a projecting conductive contact of the chassis.

4. A system comprising:
   a printed circuit board assembly (PCBA) including an electrically insulating substrate, a through-hole in the substrate and a plurality of conductive contacts arranged on a surface of the substrate next to the through-hole, a controller mounted to the substrate wherein each conductive contact is electrically coupled to the controller; and
   a chassis having an aperture aligned with the through-hole of the PCBA to receive a fastener passing through the through-hole of the PCBA and into the aperture of the chassis;
   wherein the chassis includes a number of conductive contacts next to the aperture in an arrangement that indicates a type of the chassis; and
   wherein the controller is to determine a type of the chassis based on the arrangement of conductive contacts on the chassis.

5. The system of claim 4 wherein the conductive contacts of the PCBA are arranged in a circle around the through-hole.

6. The system of claim 4 wherein the conductive contacts of the chassis are bump like projections extending from a surface of the chassis.

7. The system of claim 4 wherein the chassis has an elevated portion around the aperture and the conductive contacts of the chassis are located on the elevated portion of the chassis.

8. The system of claim 4 wherein each of the conductive contacts of the PCBA is coupled by a respective line to the controller and the controller is to determine a binary code identifying a chassis type based on a binary signal received on each respective signal line.

9. The system of claim 4 wherein each conductive contact of the PCBA is coupled to the controller by a respective signal line, each signal line is coupled to a voltage and the conductive contacts of the chassis are coupled to a circuit ground; whereby the controller is to receive a high voltage on signal lines coupled to a conductive contact of the PCBA which is in contact with a conductive contact of the chassis and a low voltage on signal lines coupled to a conductive contact of the PCBA which is not in contact with a conductive contact of the chassis.

10. The system of claim 4 wherein the controller includes a register storing codes corresponding to each chassis type and the controller is to receive signals on signal lines coupled to the plurality of conductive contacts and compare the codes in the register to the received signals to determine the chassis type.

11. The system of claim 4 wherein the controller is to cause a fan speed, Input/Output (I/O) mapping, firmware of the PCBA, or a combination thereof to be configured based on the determined chassis type.

12. A computing device comprising:
a printed circuit board assembly (PCBA);
a chassis; and
a fastener to secure the PCBA to the chassis;
the PCBA including an electrically insulating substrate, a controller and a plurality of conductive contacts arranged on a surface of the substrate around the fastener and electrically coupled to the controller;
the chassis including a number of conductive contacts arranged around the fastener in a pattern that indicates a type of the chassis;
wherein the controller is to determine a type of the chassis based on the pattern of conductive contacts of the chassis.

13. The computing device of claim 12 wherein:
the PCBA includes a through-hole and the plurality of conductive contacts of the PCBA are arranged around the through-hole;
the chassis includes an elevated portion, an aperture is in the elevated portion and the number of conductive contacts are on the elevated portion;
and wherein the fastener extends through the through-hole and the aperture.

14. The computing device of claim 12 wherein the conductive contacts of the chassis connect some or all of the conductive contacts of the PCBA to ground and the controller determines a type of the chassis based on how many conductive contacts of the PCBA are grounded, based on which particular conductive contacts are grounded, or based on a binary code generated by conductive contacts contacting the chassis.

15. The computing device of claim 12 wherein the conductive contacts of the chassis are bumps projecting from the chassis.

* * * * *